United States Patent
Brandl

(10) Patent No.: US 6,520,014 B1
(45) Date of Patent: Feb. 18, 2003

(54) MICROSENSOR HAVING A SENSOR DEVICE CONNECTED TO AN INTEGRATED CIRCUIT BY A SOLDER JOINT

(75) Inventor: Manfred Brandl, Gratwein (AU)

(73) Assignee: Austria Mikro Systeme International Aktiengesellschaft, Unterpremstätten (AT)

(*) Notice: Subject to any disclaimer, the term of this patent is extended or adjusted under 35 U.S.C. 154(b) by 0 days.

(21) Appl. No.: 09/585,417

(22) Filed: Jun. 2, 2000

(30) Foreign Application Priority Data

Jun. 2, 1999 (AU) .......................... GM385/99

(51) Int. Cl.[7] .............................. G01P 1/02; H01L 23/02
(52) U.S. Cl. .......................... 73/493; 257/678
(58) Field of Search .............................. 73/493, 514.23, 73/514.32, 431, 514.01, 514.12, 514.13, 654, 756, 866.5; 257/678, 690, 723, 724, 725, 726

(56) References Cited

U.S. PATENT DOCUMENTS

| | | | | |
|---|---|---|---|---|
| 4,700,973 A | * | 10/1987 | Gademann et al. | ........... 73/493 |
| 5,233,871 A | * | 8/1993 | Schwarz et al. | ........... 73/493 |
| 5,233,873 A | * | 8/1993 | Mozgowiec et al. | ........... 73/493 |
| 5,616,844 A | * | 4/1997 | Suzuki et al. | ........... 73/493 |
| 5,656,776 A | * | 8/1997 | Otani | ........... 73/493 |
| 5,783,748 A | * | 7/1998 | Otani | ........... 73/493 |
| 6,313,529 B1 | * | 11/2001 | Yoshihara et al. | ........... 257/724 |

FOREIGN PATENT DOCUMENTS

WO  WO 97/05463  2/1997

OTHER PUBLICATIONS

Nach dem Anmeldetag des Gebrauchsmusters wurde folgende, den anmeldungsmässen Mikrosensor beschreibende Literaturstelle veröffentlichi: e & I, Elektrotechnik und Informationstechnik, Zeitschrift des Österreichischen Verbandes fur Elektrotechnik (ÖVE–Verbandszeitschrift), 116. Jahrgang, Heft 9, Sep. 1999: Volker KEMPE: "Vom IC zum Mikrochip", Seiten 509–521, siehe Seiten 519 und 520, Abb. 13 und 14 mit dazugenhörigen Text der Beschreibung sowie Schrifttumhinweis auf Seite 521.

* cited by examiner

Primary Examiner—Helen Kwok
(74) Attorney, Agent, or Firm—Kevin E. Joyce

(57) ABSTRACT

In a microsensor with a micro-electromechanical sensor element and an integrated circuit for measuring, calibration and compensation electronics, whereby the sensor is connected electrically to the integrated circuit (IC), the micro-electromechanical sensor element is arranged directly on the integrated circuit with accurate positioning, and is connected with electric conductivity via a circulating soldered joint.

10 Claims, 1 Drawing Sheet

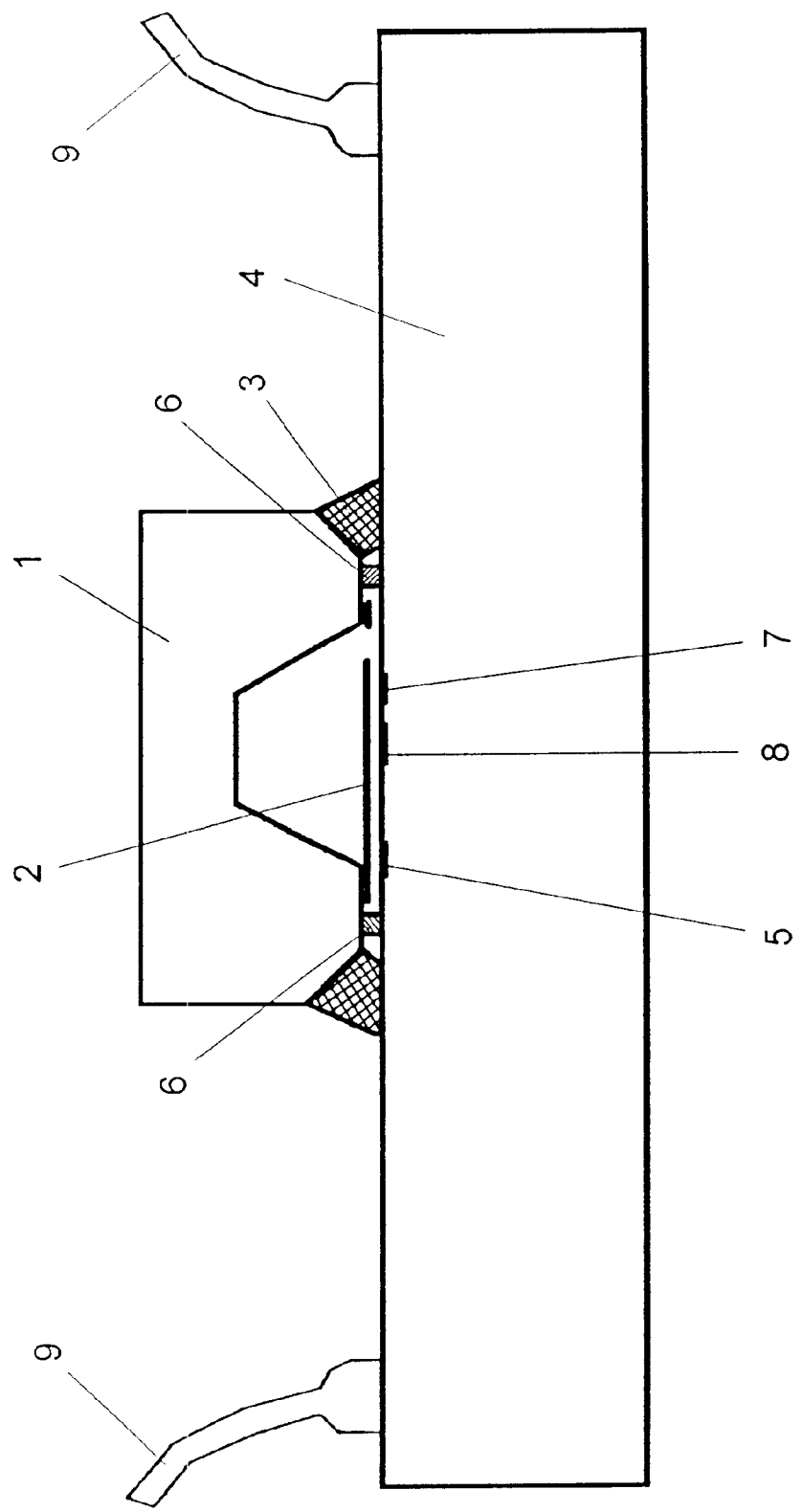

MICROSENSOR HAVING A SENSOR DEVICE CONNECTED TO AN INTEGRATED CIRCUIT BY A SOLDER JOINT

BACKGROUND OF THE INVENTION

1. Field of the Invention

The invention refers to a microsensor with a micro-electromechanical sensor element and an integrated circuit for measuring, calibration and compensation electronics, whereby the sensor element has an electric connection to the integrated circuit (IC).

2. Prior Art

Microsensors of the type mentioned above are used for a wide range of applications. In addition to proximity switches and acceleration sensors, for example semiconductor pressure sensors have already become known, in which a sensor element and a carrier of different materials are joined by soldering. As a sensor element for such pressure sensors, silicon membranes have already been suggested, whereby various degrees of compression can result due to the different e-modules of the material used. Pressure leads to deformation, and use of the piezoresistant effect of resistors diffused into silicon membranes for measuring pressures up to several 100 bar is already known. In the known microsensors, the electrical sensing is achieved using bonded pads and bonded lines or bonded wires, whereupon the evaluation is performed using integrated circuits via bonded wires. Such circuits can include conventional measuring, calibration and compensation electronics. Due to the relatively long lines between the components to be joined, there are relatively high parasitic capacities of bonded pads and wires, particularly in capacitive sensors, which cover most of the sensor's wanted signal, thus reducing the sensitivity.

Soldered joints are common in microelectronics, and in particular the electric and mechanical joining of ICs using soldering islands is known. Furthermore, flat soldered joints are known with which passive silicon components are soldered onto a carrier to produce the piezoresistant sensors mentioned above. Subsequently, the surface of the membrane must be contacted with conduction paths, whereby these contacts face away from the soldered joint side, which in turn leads to relatively long line lengths.

SUMMARY OF THE INVENTION

The aim of this invention is to create a microsensor of the type mentioned above, which is suitable for a wide range of different applications and which in particular reduces the influence of parasitic capacities to a great extent, so that in the case of capacitive sensors resolutions in the atto-Farad range are quite easily possible. To solve this problem, the microsensor according to the invention consists mainly in the fact that the micro-electromechanical sensor element is arranged directly on the integrated circuit, and is joined with accurate positioning and electric conductivity by a circulating soldered joint. Because the micro-electromechanical sensor element is arranged directly on an integrated circuit (IC) with accurate positioning and electric conductivity is provided by a circulating soldered joint, the mechanical connection provided by the soldered joint at the same time provides the electric connection with considerable shortening of the conduction path lengths, whereby the switching components required for measurement and evaluation can be arranged in the integrated circuit, i.e. directly beside the micro-electromechanical sensor element. Such a design permits the creation of highly sensitive systems that are at the same time protected from corrosion, whereby the costs of manufacture can be reduced significantly in comparison with the existing multi-component sensor systems. In such a design, the advantage of a modular structure is achieved initially by simple exchange of the micro-electromechanical component, whereby a uniform manufacturing process for various sensors using tried and tested, reliable ICs can be used. The mechanical part can be manufactured easily and reliably in terms of technology, and the connecting technology can be kept the same for various types of sensors.

The design according to the invention thereby offers the advantage that the micro-electromechanical sensor element is designed and circuited as a capacitor plate. In such a design, it is sufficient for the micro-electromechanical sensor element to be made of conductive silicon, for which conventional etching techniques are available. Subsequently, such a sensor element can be used for various parameters, whereby the preferred design is such that the micro-electromechanical sensor element is designed as an electrically conductive flexural bar for measuring distances, slopes, acceleration and/or rotating speeds. In particular the measurement of rotating speeds can be made much more sensitive with the design according to the invention, since the design can be made in such a way that radial acceleration from the measurement can be eliminated to a large extent. During rapid torsion, the Koriolis force leads to bending of such a rotating sensor element, and thus to a reduction of the dielectric gap between opposite capacitor components or capacitor plates, so that for example only the Koriolis force is measured as change in capacity, thus permitting high sensitivity and accurate measurement of the turning rates. The soldered joint according to the invention using a circulating soldered joint allows the soldered joint at the same time to be gastight, thus reducing the risk of corrosion significantly and creating the possibility to at least partly evacuate the cavity and thus the gap between the opposite capacitor plates, which acts as dielectric space, so that the extent of gas attenuation of the sensor can be influenced in a simple manner. The high sensitivity can be achieved quite simply by designing the integrated circuit in such a was that there is a capacitor surface for a reference capacity beneath the micro-electromechanical flexural bar in the area of the projection of the link for the unilaterally mounted flexural bar. With such a design, a reference capacity for electronic evaluation and compensation is at the same time provided and thus the compensation and evaluation of signals is facilitated considerably.

In gas-filled micro-electromechanical components, the electrically conductive flexural bar is generally gas-attenuated to an over-critical degree. In such cases, the sensitivity can be increased considerably by arranging an electrode for applying an electrostatic force to the flexural bar on the IC within the projection of the flexural bar. An electrostatic force that is not directly correlated with the applied voltage makes it possible to stabilise the flexural bar and at the same time to increase the useful frequency range of the oscillation, whereby for example pulse-width modulated voltage surges can be applied with unchanged voltage to the electrode in order to provide the electrostatic force.

A particularly cost-efficient production of the microsensor is possible due to the fact that the micro-electromechanical component is designed as a back-etched cuboid of electrically conductive Si, and is connected to the IC over a spacer by a gastight, circulating soldered joint. The preferred design of the circulating soldered joint as a gastight joint thereby provides the possibility to at least partly evacuate the corresponding cavity, or to fill it with other gases, thus improving the sensitivity or the measurable frequency range. In the case of pressure sensors, an according pressurization of the flexural bar through appropriate drill holes or breakthroughs in the mechanical component is naturally possible, whereby the electrically conductive membrane can be designed as a multi-laterally mounted flexural bar and in particular as a gastight membrane, rather than a unilaterally mounted flexural bar. In such a case, the circulating soldered joint can again be gastight, since it is sufficient to provide the relevant gas entries on the side of the membrane facing away from the soldered joint.

To reduce the risk of corrosion, the design is advantageously so that the cavity formed between the IC and the micro-electromechanical component is evacuated.

BRIEF DESCRIPTION OF THE DRAWING

In the following, the invention is explained in more detail based on a schematic drawing.

DETAILED DESCRIPTION OF PREFERRED EMBODIMENTS OF THE INVENTION

In the FIGURE, a micro-electromechanical sensor element (1) consisting of electrically conductive silicon is shown. A flexural bar (2) is formed by back-etching, which in turn forms a capacitor plate, which in turn is connected to an IC (4) in an electrically conductive manner by a circulating soldered joint (3). Thereby, the integrated circuit (IC) (4) has a contact surface (5) on the surface facing the capacitor plate (2) of the micro-electromechanical sensor element (1), which together with the electrically conductive plate of the flexural bar (2) forms a reference capacitor, since the gap between this surface and the flexural bar (2) is subject to only minor changes, even on articulation of the flexural bar (2). Thereby, the gap is defined primarily by the spacer (6).

In case of acceleration, tilting or rotation, the dielectric gap between the flexural bar (2) and the electrically conductive plates of the IC underneath changes, whereby the capacitor plate of the measuring sensor defined on the IC is referred to as (7). Between the two capacitor plates (5) and (7) of the IC (4), there is a further electrode (8), via which an electrostatic force can be applied to the flexural bar (2), allowing it to be stabilised in terms of articulation and sensitivity.

The signal registered, compensated and evaluated in the IC (4) can subsequently be delivered to a display unit or other downstream evaluation units via bonded wires (9).

Of particular advantage thereby is the possibility of total electrical screening of the sensors, when the mechanical part and the substrate of the IC are connected to ground potential through the circulating soldered joint which forms a single, uninterrupted gastight soldered joint. Due to design-related metal protection, the sensor can be packed in simple plastic casing, which would not be possible so easily with monolithic sensor designs.

What I claim is:

1. A microsensor for measuring, calibration and compensation electronics, said microsensor comprising a micro-electromechanical sensor device mechanically and electrically connected to an integrated circuit by a single soldered joint disposed between said device and the integrated circuit in a pattern defining a cavity within which a mechanical portion of said device is located, said soldered joint forming the sole electrical connection between the sensor device and said integrated circuit.

2. A microsensor according to claim 1, wherein said portion comprises a capacitor plate.

3. A microsensor according to claim 1 or 2, wherein said portion comprises an electrically conductive flexible bar disposed within said cavity.

4. A microsensor according to claim 3, wherein said flexible bar is a cantilevered element and wherein the microsensor further comprises a capacitor plate formed on the integrated circuit in facing relationship with a proximal end of the conductive cantilevered element to form a reference capacitor.

5. A microsensor according to claim 3, further comprising an electrode formed on the integrated circuit in facing relationship with the flexible bar for applying an electrostatic force to the bar.

6. A microsensor according to claim 4, further comprising an electrode formed on the integrated circuit in facing relationship with the flexible bar at a location intermediate said proximate end and a distal end of the bar for applying an electrostatic force to the bar.

7. A microsensor according to claim 1, wherein said device further comprises a back-etched cuboid of electronically conductive Si spaced from the integrated circuit by a spacer element disposed within said cavity.

8. A microsensor according to claim 1, wherein said cavity is evacuated.

9. A microsensor according to claim 4, further comprising an additional capacitor plate formed on the integrated circuit in facing relationship with a distal end of the conductive cantilevered bar to form an additional capacitor.

10. A microsensor according to claim 6, further comprising an additional capacitor plate formed on the integrated circuit in facing relationship with the distal end of the conductive cantilevered bar to form an additional capacitor.

* * * * *